(12) United States Patent
Kim et al.

(10) Patent No.: US 9,185,769 B2
(45) Date of Patent: Nov. 10, 2015

(54) LIGHT SOURCE APPARATUS AND VEHICLE HEADLIGHT USING THE SAME

(71) Applicant: SAMSUNG ELECTRONICS CO., LTD., Suwon-si, Gyeonggi-do (KR)

(72) Inventors: Sun Ki Kim, Gyeonggi-do (KR); Kyung Pil Nam, Gyeonggi-do (KR); Young Hwan Jung, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 245 days.

(21) Appl. No.: 13/930,899

(22) Filed: Jun. 28, 2013

(65) Prior Publication Data

US 2014/0097749 A1  Apr. 10, 2014

(30) Foreign Application Priority Data

Oct. 10, 2012 (KR) .................. 10-2012-0112206

(51) Int. Cl.
 H05B 37/00 (2006.01)
 H05B 33/08 (2006.01)

(52) U.S. Cl.
 CPC .......... H05B 33/089 (2013.01); H05B 33/083 (2013.01); H05B 33/0815 (2013.01); H05B 33/0827 (2013.01)

(58) Field of Classification Search
 None
 See application file for complete search history.

(56) References Cited

U.S. PATENT DOCUMENTS

| 7,262,559 | B2 | 8/2007 | Tripathi et al. | |
|---|---|---|---|---|
| 7,321,206 | B2 | 1/2008 | Kang et al. | |
| 7,638,947 | B2 * | 12/2009 | Ito et al. | 315/77 |
| 7,667,414 | B2 * | 2/2010 | Fujino et al. | 315/307 |
| 7,884,557 | B2 | 2/2011 | Steele et al. | |
| 8,058,810 | B2 * | 11/2011 | Chen et al. | 315/209 R |
| 8,084,960 | B2 * | 12/2011 | Kuo et al. | 315/297 |
| 8,344,661 | B2 * | 1/2013 | Hsu et al. | 315/307 |
| 8,558,483 | B2 * | 10/2013 | Lee et al. | 315/307 |
| 8,928,231 | B2 * | 1/2015 | Campos et al. | 315/122 |
| 8,941,323 | B1 * | 1/2015 | Wu et al. | 315/291 |
| 2003/0151370 | A1 * | 8/2003 | Nakayama et al. | 315/77 |
| 2004/0080273 | A1 * | 4/2004 | Ito et al. | 315/77 |
| 2005/0200287 | A1 * | 9/2005 | Ito et al. | 315/82 |
| 2008/0180968 | A1 * | 7/2008 | Konishi | 362/539 |
| 2009/0289559 | A1 * | 11/2009 | Tanaka et al. | 315/185 R |
| 2010/0128463 | A1 * | 5/2010 | Kim et al. | 362/84 |
| 2010/0270927 | A1 * | 10/2010 | Noyori et al. | 315/77 |
| 2010/0327835 | A1 | 12/2010 | Archibald | |
| 2011/0254446 | A1 * | 10/2011 | Tominaga et al. | 315/82 |
| 2012/0062148 | A1 | 3/2012 | Kim et al. | |
| 2012/0262068 | A1 * | 10/2012 | Chi et al. | 315/122 |
| 2013/0038213 | A1 * | 2/2013 | Son et al. | 315/122 |
| 2013/0293109 | A1 * | 11/2013 | Cheon et al. | 315/122 |
| 2015/0015143 | A1 * | 1/2015 | Inada | 315/77 |

FOREIGN PATENT DOCUMENTS

| JP | 2009-099894 A | 5/2009 |
|---|---|---|
| JP | 2012-004240 A | 1/2012 |

(Continued)

*Primary Examiner* — Tuan T Lam
(74) *Attorney, Agent, or Firm* — McDermott Will & Emery LLP (57) ABSTRACT

There are provided a light source apparatus and a vehicle headlight using the same. The light source apparatus includes a light emitting device array unit, a first detection unit, a driving unit, a second detection unit, and an interruption unit. A uniform quantity of light can be maintained and damage can be prevented.

20 Claims, 8 Drawing Sheets

(56) References Cited

FOREIGN PATENT DOCUMENTS

| | | |
|---|---|---|
| JP | 2012-100415 A | 5/2012 |
| KR | 10-0611177 B1 | 8/2006 |
| KR | 10-0859562 B1 | 9/2008 |
| KR | 10-0994204 B1 | 11/2010 |
| KR | 10-2011-0133201 A | 12/2011 |
| KR | 10-2011-0134607 A | 12/2011 |
| KR | 10-2011-0135750 A | 12/2011 |
| KR | 10-2012-0019309 A | 3/2012 |

* cited by examiner

LIGHT SOURCE APPARATUS AND VEHICLE HEADLIGHT USING THE SAME

CROSS-REFERENCE TO RELATED APPLICATION

This application claims the priority to Korean Patent Application No. 10-2012-0112206, filed on Oct. 10, 2012, in the Korean Intellectual Property Office, the disclosure of which is incorporated herein by reference.

TECHNICAL FIELD

The present application relates to a light source apparatus and a vehicle headlight using the same.

BACKGROUND

A semiconductor light emitting device, such as a light emitting diode (LED), is a device including a material that emits light through the application of electrical energy thereto, in which energy generated by electron hole recombination in semiconductor junction parts is converted into light to be emitted therefrom. LEDs are commonly employed as light sources in general illumination devices, display devices, and the like, and the development of LEDs has been accelerated.

In particular, recently, the development and employment of light emitting diodes (LEDs) (e.g., gallium nitride-based semiconductor light-emitting devices) has increased, and mobile device keypads, vehicle turn signal lamps, camera flashes, and the like, using such LEDs, have been commercialized, and in line with this, the development of general illumination devices using LEDs has been accelerated. Like the products to which they are applied, such as a vehicle headlight, a backlight unit of a large TV, a vehicle headlamp, a general illumination device, and the like, products in which LEDs are utilized are gradually moving toward large-sized products having high output levels and high efficiency, and thus, the characteristics of LEDs used in such products are required to satisfy the high level characteristics.

As the purpose of light emitting diodes has extended to vehicle headlights, a method for maintaining a uniform quantity of light emitted by LEDs and preventing damage when some of LEDs have an error is required.

SUMMARY

An aspect of the present application provides a light source apparatus in which when some light emitting devices in a light emitting device array have an error, the entire light emitting device array are turned off, to thus maintain a uniform quantity in light emitted by a light emitting device array in a turned-on state and prevent damage.

Another aspect of the present application provides a vehicle headlight in which when some light emitting devices in a light emitting device array have an error, the entire light emitting device array is turned off, to thus maintain a uniform quantity of light in a light emitting device array in a turned-on state and prevent damage thereto.

According to an aspect of the present application, there is provided a light source apparatus including: a light emitting device array unit in which light emitting device strings formed by connecting a plurality of light emitting devices in series are connected in parallel. A first detection unit is connected to an output terminal of the light emitting device array unit and detects whether any one of the light emitting device strings is opened. A driving unit supplies driving power to the light emitting device array unit. A second detection unit detects whether an opening or a short-circuit between an input terminal and the output terminal of the light emitting device array unit has occurred. An interruption unit connects an external power source applying power to the driving unit to an input terminal of the driving unit, and interrupts power supplied to the driving unit when an opening is detected by the first detection unit or when an opening or a short-circuit is detected by the second detection unit.

The first detection unit may include a plurality of switching elements connected to the plurality of light emitting device strings in series, respectively. Collectors of the switching elements are connected to the light emitting device strings and emitters thereof are connected to bases of different adjacent switching elements such that the switching elements are sequentially connected.

The second detection unit may include a switching element, wherein when a current applied to a gate thereof from the driving unit is interrupted, the switching element may turn off an output signal output to the interruption unit.

The switching element may be a transistor.

The interruption unit may include first, second, and third switching elements, wherein a base of the second switching element may be connected to an output terminal of the second detection unit and a collector thereof may be connected to a gate of the third switching element, so that when opening is detected by the second detection unit, the second switching element is turned off to interrupt a current flowing through the third switching element A base of the first switching element may be connected to an output terminal of the first detection unit and a collector thereof may be connected to an emitter of the second switching element, so that when opening is detected by the second detection unit, the first switching element is turned off to interrupt a current flowing through the second switching element. A gate of the third switching element may be connected to the collector of the second switching element, so that when the first or second switching element is turned off, the third switching element is also turned off to cut off power supplied to the driving unit.

The first and second switching elements may be transistors, and the third switching element may be a P-channel field effect transistor (FET).

The interruption unit may further include a capacitor connected to a source and a drain of the third switching element in parallel.

A diode may be connected to an input terminal of the interruption unit in a forward direction.

According to another aspect of the present application, there is provided a vehicle headlight. The vehicle headlight includes a light source apparatus having a light emitting device array unit in which light emitting device strings are formed by connecting a plurality of light emitting devices in series in parallel. A first detection unit is connected to an output terminal of the light emitting device array unit and detects whether any one of the light emitting device strings is opened. A driving unit supplys driving power to the light emitting device array unit. A second detection unit detects whether opening or a short-circuit between an input terminal and the output terminal of the light emitting device array unit has occurred. An interruption unit connects an external power source applying power to the driving unit to an input terminal of the driving unit, and interrupts power supplied to the driving unit when an opening is detected by the first detection unit or when an opening or a short-circuit is detected by the second detection unit. A reflective unit is provided above the light emitting device array unit to reflect light output from the light emitting device array unit. A lens cover unit disperses light reflected by the reflective unit to the outside.

The first detection unit may include a plurality of switching elements connected to the plurality of light emitting device strings in series, respectively. Collectors of the switching elements are connected to the light emitting device strings and emitters thereof are connected to bases of different adjacent switching elements such that the switching elements are sequentially connected.

The second detection unit may include a switching element, wherein when a current applied to a gate thereof from the driving unit is interrupted. The switching element may turn off an output signal output to the interruption unit.

The switching element may be a transistor.

The interruption unit may include first, second, and third switching elements, wherein a base of the second switching element may be connected to an output terminal of the second detection unit and a collector thereof may be connected to a gate of the third switching element, so that when opening is detected by the second detection unit, the second switching element is turned off to interrupt a current flowing through the third switching element A base of the first switching element may be connected to an output terminal of the first detection unit and a collector thereof may be connected to an emitter of the second switching element, so that when opening is detected by the second detection unit, the first switching element is turned off to interrupt a current flowing through the second switching element A gate of the third switching element may be connected to the collector of the second switching element, so that when the first or second switching element is turned off, the third switching element is also turned off to cut off power supplied to the driving unit.

The vehicle headlight may further include a heat dissipation unit provided under the light emitting device array unit to dissipate heat generated by the light emitting device array unit outwardly.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings. In the drawings, the shapes and dimensions of elements may be exaggerated for clarity, and the same reference numerals will be used throughout to designate the same or like components.

Figure 1:
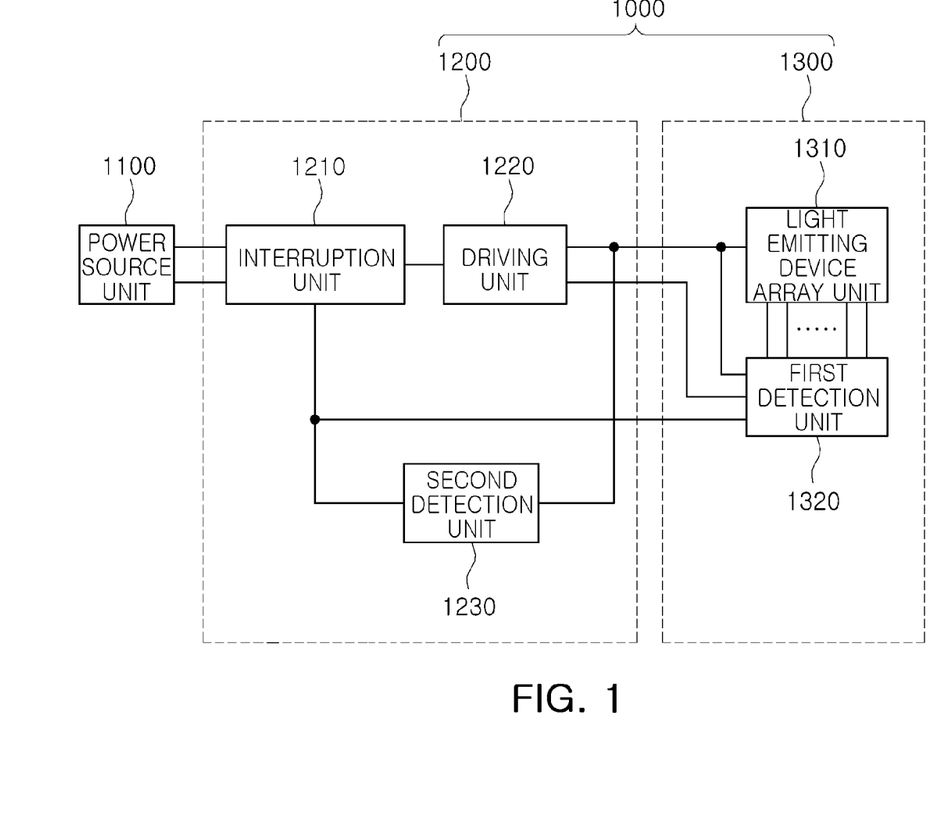
FIG. 1 is a block diagram of a light source apparatus according to an example of the present application.
Figure 2:
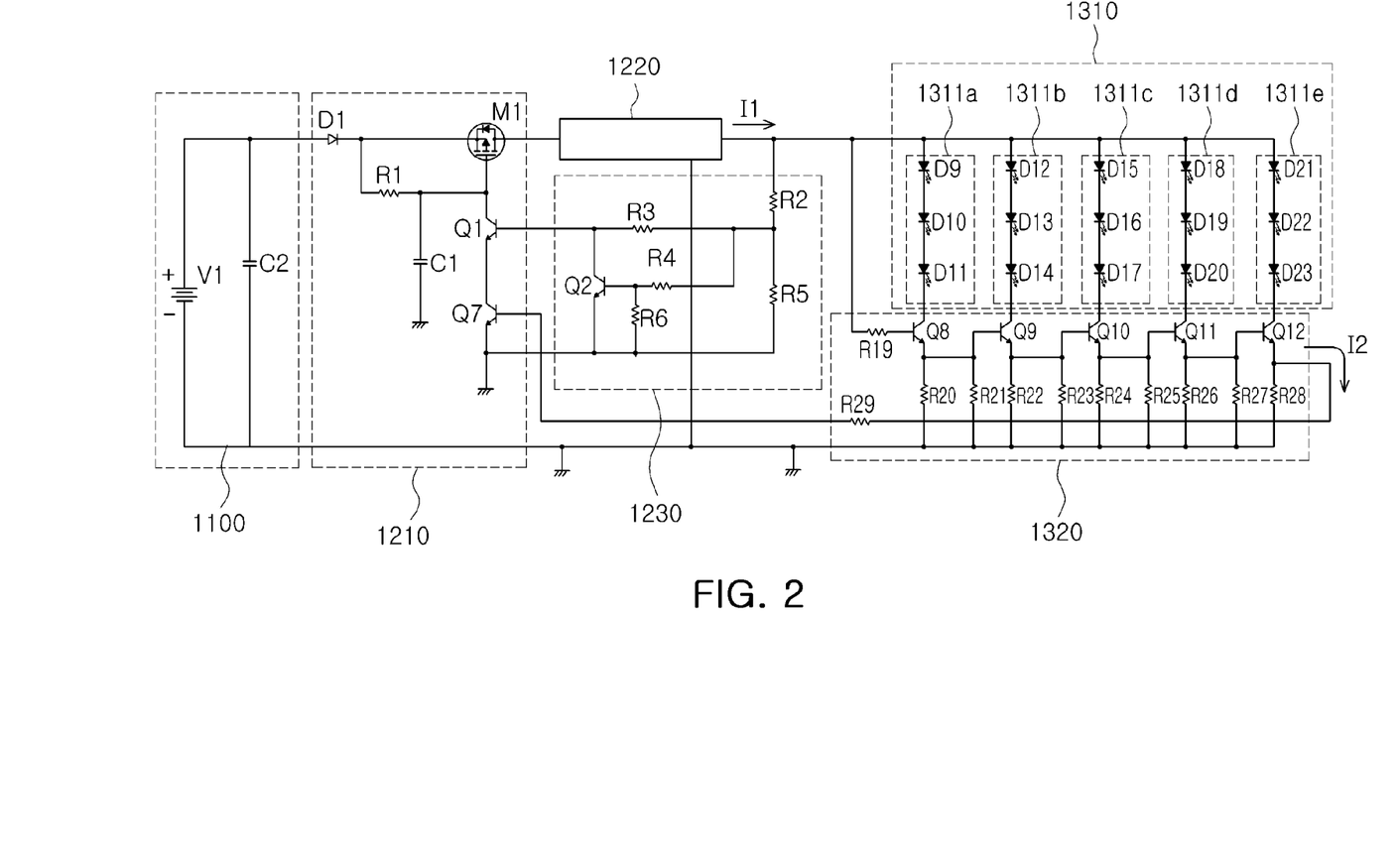
FIG. 2 is a circuit diagram of the light source apparatus according to an example of the present application.

FIG. 1 is a block diagram of a light source apparatus according to an example of the present application, and FIG. 2 is a circuit diagram of the light source apparatus according to an example of the present application. As illustrated in FIG. 1, a light source apparatus 1000 according to an example of the present application includes a light emitting device array unit 1310 in which light emitting device strings 1311 (FIG. 2) are connected in parallel, a first detection unit 1320 detecting whether any one of the light emitting device strings 1311 is opened, a driving unit 1220 supplying driving power to the light emitting device array unit 1310, a second detection unit 1230 detecting whether the light emitting device array unit 1310 is opened or short-circuited, and an interruption unit 1210 interrupting power supplied to the driving unit 1220.

The light emitting device array unit 1310 includes a plurality of light emitting devices D9 to D23, as shown in FIG. 2. The plurality of light emitting devices D9 to D23 are disposed to form a plurality of light emitting device strings 1131*a* to 1131*e*. The plurality of light emitting device strings 1311*a* to 1311*e* are disposed to be connected in parallel. The light emitting devices D9 to D23 may be any device type as long as they emit light when an electrical signal is applied thereto. Preferably, light emitting diodes (LEDs) may be used as the light emitting devices. The amount of the light emitting devices D9 to D23 constituting the light emitting device strings 1311*a* to 1311*e* and the amount of the light emitting device strings 1311*a* to 1311*e* are not limited to a predetermined number, and determined by power, the driving unit 1220 may be able to supply to the light emitting device array unit 1310.

In the light emitting device array unit 1310, the plurality of light emitting device strings 1311*a* to 1311*e* are disposed in parallel, so even in the case that some of the light emitting device strings are damaged, the other light emitting devices are turned on (or lighted). This may be useful if the other light emitting devices are required to be turned on in the case that some of the light emitting devices are not turned on, but there may be difficulty in maintaining a uniform quantity of light. For example, in the case of a vehicle headlight, of which the lowest amount of a quantity of emitted light is limited by regulations, when some of the plurality of light emitting devices are not turned on (or are not lighted), a sufficient quantity of light may not be secured in operating the headlight, violating the regulations. Thus, in the case that some of the plurality of light emitting devices are damaged and thus cannot be turned on, if the remaining light emitting devices are not turned on, a user can easily determine whether a quantity of light satisfies the regulations.

Also, when some of the light emitting devices are damaged, the entirety of the light emitting device array unit 1310 may be opened or short-circuited. In this case, if power supplied to the light emitting device array unit 1310 is not cut off, the entirety of the light emitting device array unit 1310 may be damaged. In an example of the present application, when opening or short-circuiting occurs between an input terminal and an output terminal of the light emitting device array unit 1310, power is cut to prevent damage to the light emitting device array unit 1310.

The first detection unit 1320 is connected to the output terminal of the light emitting device array unit 1310 and detects whether any one of the light emitting device strings 1311 is opened. The first detection unit 1320 may include a plurality of switching elements Q8 to Q12 connected to the plurality of light emitting device strings in series 1311, respectively, and in this case, collectors of the switching elements Q8 to Q12 are connected to output terminals of the light emitting device strings 1311, respectively.

The switching elements Q8 to Q11, excluding the switching element Q12 connected to the interruption unit 1210, may be connected to bases of other switching elements adjacent to the emitters of the respective switching elements. Here, the emitters of the respective switching elements Q8 to Q12 may be connected to bases of adjacent switching elements. Thus, if any one of the light emitting device strings 1311 is opened so a current does not flow, a current applied to a base of an adjacent switching element is interrupted, and thus, the adjacent switching element is turned off.

Figure 3:
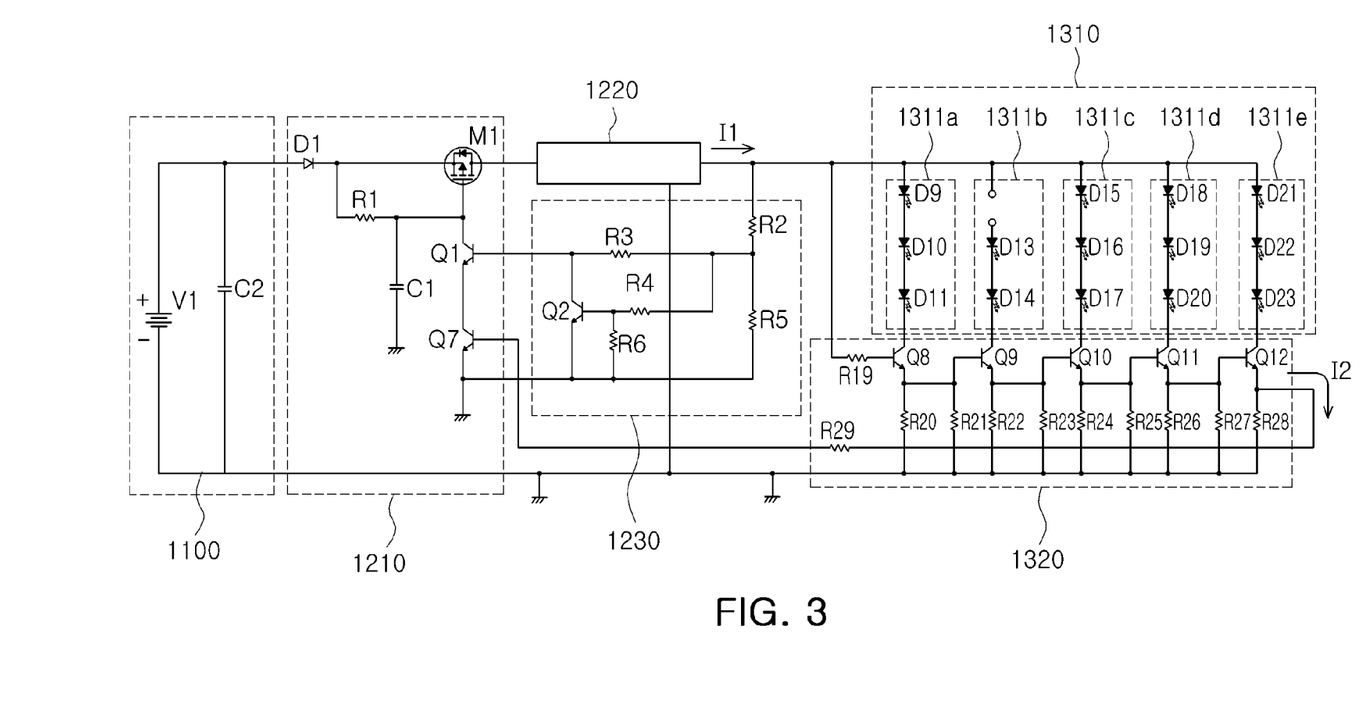
FIG. 3 is a circuit diagram illustrating a case in which one of a plurality of light emitting module strings in FIG. 2 is opened.

In detail, referring to FIG. 3, when a light emitting device D12 is damaged so the light emitting device string 1311*b* is opened, a current, which passes through the switching element Q9 and flows to the base of the switching element Q10 is interrupted, and thus, the switching element Q10 is turned off and the switching elements Q11 and Q12 are also subsequently turned off. Accordingly, a current I2 applied to the interruption unit 1210 does not flow, turning off a switching element M1.

The second detection unit 1230 detects whether or not an opening or a short-circuit between the input terminal and the output terminal of the light emitting device array unit 1310 has occurred. The second detection unit 1230 is connected to an output terminal of the driving unit 1220, and when a current applied to the light emitting device array unit 1310 is changed, the second detection unit 1230 detects the change and enables the interruption unit 1210 to interrupt a current supplied to the driving unit 1220. In detail, the second detection unit 1230 may include a switching element Q2. When a current applied by the driving unit 1220 to a base thereof is interrupted, the switching element Q2 may turn off an output signal connected to the interruption unit 1210 to interrupt a current supplied from the external power source unit 1100 to the driving unit 1220.

The driving unit 1220 supplies driving power to the light emitting device array unit 1310. As the driving unit 1220, a DC-DC converter, which converts a converted DC voltage into a current appropriate for driving the light emitting device array unit 1310 and supplies the same, may be used. For example, a step-down converter (or a buck converter) is used when a voltage of the external power source unit 1100 is higher than a driving voltage of the light emitting devices D9 to D23. A step-up converter (or a boost converter) is used when a voltage of the external power source unit 1100 is lower than the driving voltage of the light emitting devices D9 to D23. A buck-boost converter is used when a voltage of the external power source unit 1100 is changed from a level higher than the driving voltage to a level lower than the driving voltage, or the like, may be used.

The interruption unit 1210 connects the external power source unit 1100, from which power is applied to the driving unit 1220, to the input terminal of the driving unit 1220. When an opening is detected by the first detection unit 1320 or when an opening or a short-circuit is detected by the second detection unit 1230, the interruption unit 1210 cuts off power supplied to the driving unit 1220 to prevent supplying an overcurrent which may damage the driving unit 1220 and the light emitting device array unit 1310. Here, the external power source unit 1100 may be a power supply device of a vehicle headlamp. Also, a diode D1 may be installed in an input terminal of the interruption unit 1210 in order to prevent the driving unit 1220 from being damaged when a reverse voltage is applied from the external power source unit 1100.

The interruption unit 1210 connects the external power source unit 1100 and the input terminal of the driving unit 1220, and when an opening is detected by the first detection unit 1320 or when an opening or a short-circuit is detected by the second detection unit 1230, the interruption unit 1210 cuts off power supplied to the driving unit 1220.

The interruption unit 1210 may include a first switching element Q7, a second switching element Q1, and a third switching element M1.

A base of the first switching element Q7 may be connected to an output terminal of the first detection unit 1320, and a collector thereof may be connected to the second switching element Q1. Thus, when the output current I2 is supplied from the first detection unit 1320, the first switching element Q1 is maintained in a turned-on state, and when the output current I2 is interrupted as the first detection unit 1320 detects opening of at least one of the light emitting devices D9 to D23, the first switching element Q1 is turned off. When the first switching element Q7 is turned off, a voltage applied to the gate of the third switching element M1 and a voltage input to a source thereof are equal, so the third switching element M1 is turned off.

A base of the second switching element Q1 may be connected to an output terminal of the second detection unit 1230, a collector thereof may be connected to the gate of the third switching element M1, and an emitter thereof may be connected to a collector of the first switching element Q7. Thus, in a normal state, the second switching element Q1 is maintained in a turned-on state by a current supplied through resistors R2 and R3 from the driving unit 1220, and when an output signal from the second detection unit 1230 is interrupted as the light emitting device array unit 1310 is opened or short-circuited, the second switching element Q1 is turned off. When the second switching element Q1 is turned off, a voltage applied to the gate of the third switching element M1 and a voltage input to the source thereof are equal, and thus, the third switching element M1 is turned off.

A gate of the third switching element M1 is connected to a collector of the second switching element Q1, so when the first or second switching element Q7 or Q1 is turned off, the third switching element M1 is also turned off, cutting off power supplied from the external power source unit 1100 to the driving unit 1220. Also, the diode D1 is connected to the input terminal of interruption unit 1210 in a forward direction to prevent a reverse voltage from being applied from the external power source unit 1100.

As the first and second switching elements Q7 and Q1, an NPN transistor may be used, and the second switching element M1 may be a P channel field effect transistor (FET), but the present application is not limited thereto.

The interruption unit 1210, the driving unit 1220, and the second detection unit 1230 may be installed on a single board to constitute a light emitting device array driving module 1200, and the light emitting device array unit 1310 and the first detection unit 1320 may be installed on another board to constitute a light emitting device array module 1300, but the present application is not necessarily limited thereto. Also, as the external power source unit 1100, a power supply device of a vehicle headlamp may be used, but the present application is not necessarily limited thereto.

Hereinafter, an operation of the light source apparatus 1000 having the foregoing configuration will be described.

First, referring to FIG. 2, a case in which the light emitting device array unit 1310 normally operates will be described. A portion of a current I1 supplied from the external power source unit 1100 is applied to the gate of the switching element M1 through a resistor R1. In an example where a P-channel FET is used as the switching element M1, a voltage of the gate thereof is lower than a voltage of a source thereof due to the resistor R1, so the switching element M1 is turned on and a current is supplied to the driving unit 1220. When a current is supplied to the driving unit 1220, the driving unit 1220 supplies driving power to the input terminal of the light emitting device array unit 1310 to turn on the light emitting devices D9 to D23 of the light emitting device array unit 1310. In detail, the current supplied from the driving unit 1220 turns on the light emitting device string 1311a and is supplied to the collector of the switching element Q8. The current supplied to the switching element Q8 is applied to the base of the adjacent switching element Q9 connected to the emitter of the switching element Q8 to turn on (or light) the light emitting device string 1311b. In this manner, the switching elements Q10 to Q12 are sequentially turned on to turn on (or light) the light emitting device strings 1311c to 1311e connected thereto, respectively. The current is applied to the base of the switching element Q7 of the interruption unit 1210 to turn on the switching element Q7.

Also, a portion of the driving current is applied to the resistors R3 and R4 through the resistor R2. In this particular example, a value of the resistor R3 is determined as a value sufficient to turn on the switching element Q1 while a value of a resistor R6 is determined as a value not sufficient to turn on the switching element Q2. Then, since only the switching element Q1 is turned on, the switching element M1 is maintained in a turned-on state.

Hereinafter, an operation when any one light emitting device D10 in the light emitting device array unit 1310 will be described with reference to FIG. 3. As described above, in a state that a driving current is supplied to turn on the light emitting device array unit 1310, when the light emitting device D10 is damaged to be opened, a current flowing to the light emitting device string 1131b is interrupted. Thus, there is no current applied to the base of the switching unit Q10, turning off the switching element Q10. Accordingly, the switching elements Q11 and Q12 are subsequently turned off to interrupt the current I2 applied to the interruption unit 1210. Accordingly, power applied to the base of the switching element Q7 is cut off, turning off the switching element Q7, and thus, a voltage of the gate of the switching element M1 and a voltage of the source thereof are equal, turning off the switching element M1, and as a result, a current applied to the driving unit 1220 is interrupted to interrupt a current supplied to the light emitting device array unit 1310.

Figure 4:
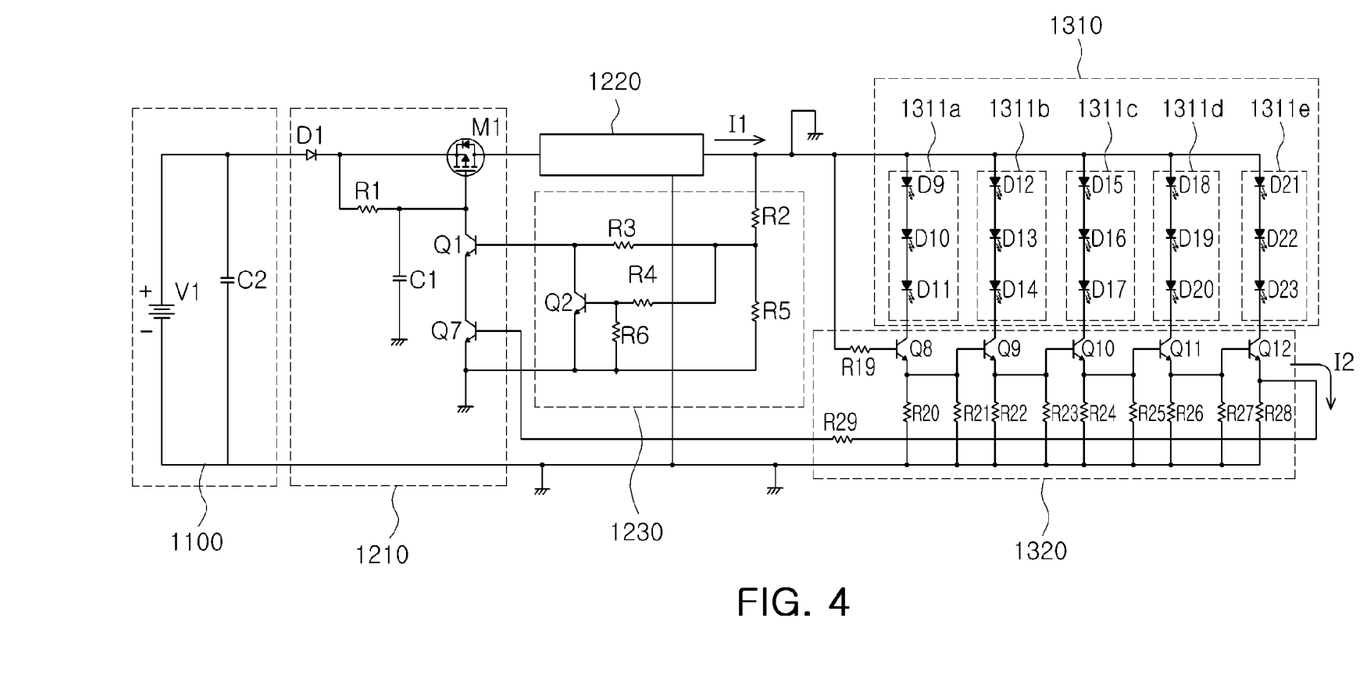
FIG. 4 is a circuit diagram illustrating a case in which a light emitting device array unit in FIG. 2 is short-circuited.

Hereinafter, an operation when the input terminal and the output terminal of the light emitting device array unit 1310 are short-circuited will be described. When the light emitting device array unit 1310 is short-circuited, the current I1 from the driving unit 1220 flows entirely to a ground, so a current applied to the base of the switching element Q8 of the first detection unit 1320 is interrupted to turn off the switching element Q8. Accordingly, the switching elements Q9 to Q12 are sequentially turned off, and the current I2 flowing to the interruption unit 1210 is also interrupted. Thus, the light emitting device strings 1311a to 1311e connected to the switching elements Q8 to Q12, respectively, are also turned off. Since the entire current flows through a ground, a current flowing through the resistor R2 is also interrupted to interrupt a current applied to the base of the switching element Q1, turning off the switching element Q1. Since voltages of the source and the gate of the switching element M1 are equal, the switching element M1 is also turned off. Since the switching element M1 is turned off, a current applied to the driving unit 1220 is interrupted to thus interrupt a current supplied to the light emitting device array unit 1310.

Figure 5:
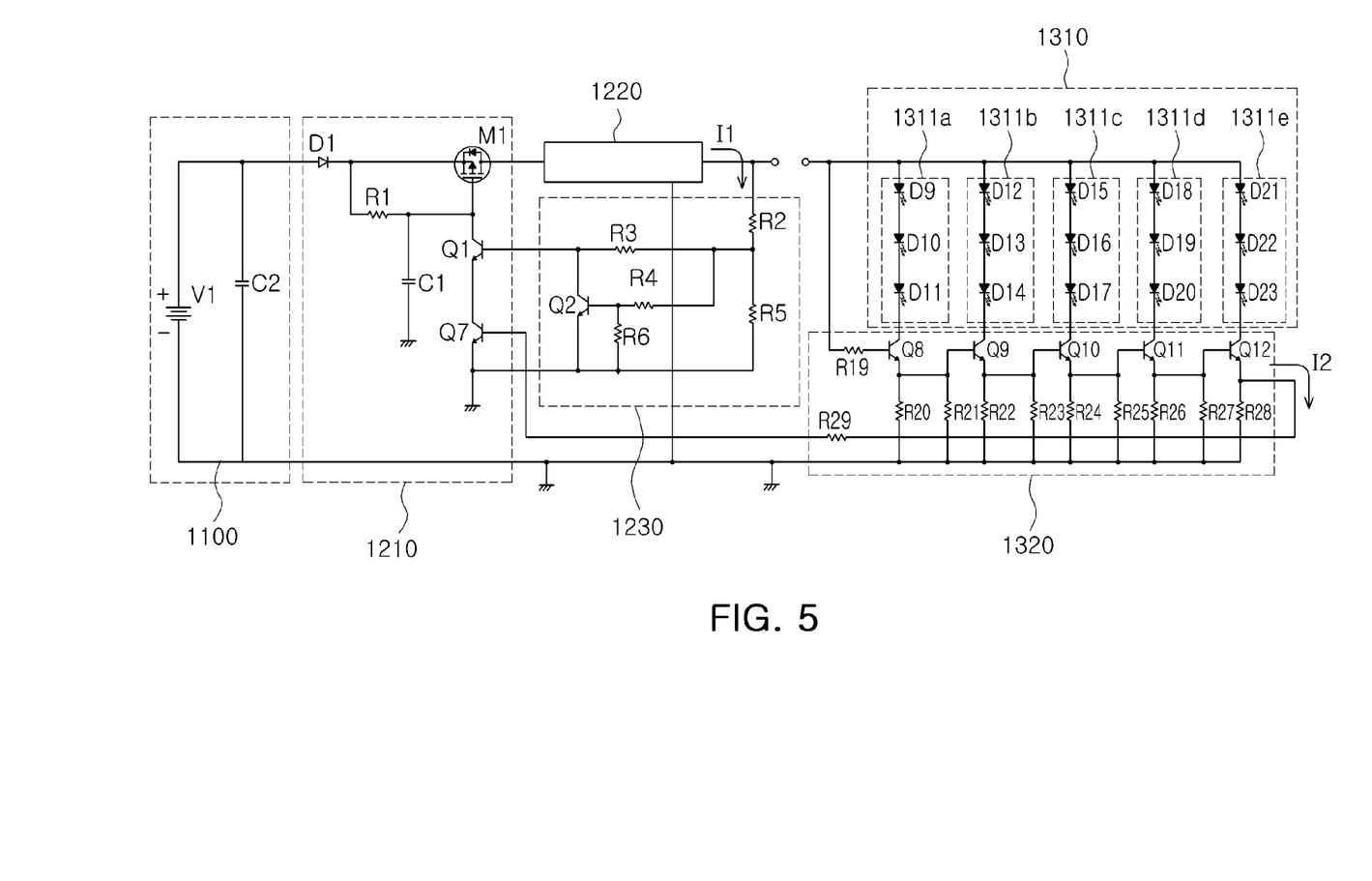
FIG. 5 is a circuit diagram illustrating a case in which a light emitting device array unit in FIG. 2 is opened.

Hereinafter, an example in which the light emitting device array unit 1310 is opened will be described with reference to FIG. 5. When the light emitting device array unit 1310 is opened, the current I1 from the driving unit 1220 entirely flows through the resistor R2. Thus, a current does not flow to the light emitting device array unit 1310 like the case of being short-circuited, the light emitting device array unit 1310 is turned off and the current I2 flowing to the interruption unit 1210 is also interrupted. Accordingly, the current I2 turns on the switching element Q1, and a current applied to the base of the switching element Q1 is reduced, turning off the switching element Q1. When the switching element Q1 is turned off, the switching element M1 is also turned off as if short-circuited, interrupting a current supplied to the light emitting device array unit 1310.

As described above, when any one of the light emitting devices of the light emitting device array unit 1310 is damaged to be opened or when both ends of the light emitting device array unit 1310 are opened or short-circuited, all the light emitting devices are turned off and power supplied to the driving unit 1220 is cut off, thus protecting the light source apparatus 1000 including the light emitting device array unit 1310.

Figure 6:
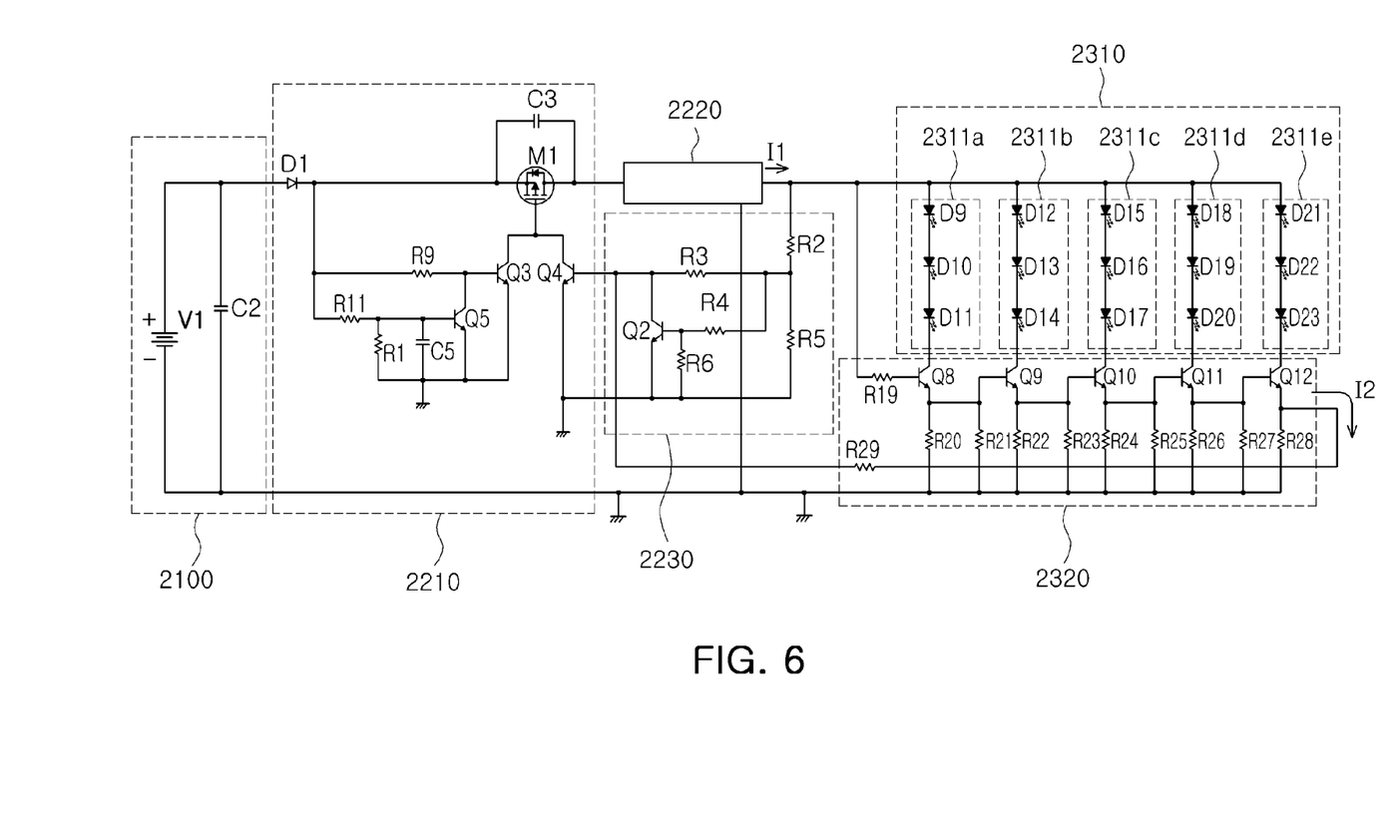
FIG. 6 is a circuit diagram of a light source apparatus according to another example of the present application.

Hereinafter, a light source apparatus 2000 according to another example of the present application will be described. As illustrated in FIG. 6, the light source apparatus 2000 according to another example of the present application includes an interruption unit 2210 having a configuration different from that of the interruption unit of the former example, and the other configuration of the light source apparatus 2000 may be the same as that of the former example.

The present example provides a configuration for guaranteeing an operation of a circuit when a voltage applied when the light source apparatus 2000 is initially driven is gradually increased. In the example where the driving voltage is gradually increased, there is a problem in that a P-channel FET is not turned on. Thus, if a voltage is unstable at the initial stage of driving, the switching element M1 of the interruption unit 2210 is not turned on to cause a problem in which the light emitting device array unit 1310 is not turned on. In the present example, in order to solve such a problem, a capacitor C3 is connected in parallel to the switching element M1, the collector of the switching element Q3 is connected to the gate of the switching element M1, and a gate of the switching element Q5 is connected to the base of the switching element Q3. Through this configuration, even in the case that the voltage is unstable at the initial stage of driving in the light source apparatus 2000, the capacitor C3 allows the both ends of the switching element M1 to be maintained in a conducted state. Also, when an initial voltage is increased, the switching element Q3 is turned on through a resistor R9, and thus, the circuit operates normally as in the example described above. Also, when the voltage is increased to be higher than a predetermined voltage level, the switching element Q5 is turned on by a voltage applied to a resistor R11, so the switching element Q3 is turned off.

In this case, since the driving unit 2220 operates normally, the switching element Q4 is turned on, and thus, the switching element M1 is maintained in a turned-on state. The other configuration excluding the interruption unit 2210 is the same as that of the former example described above, so even when the light emitting device array unit 2310 has an error, the light source apparatus 2000 including the light emitting device array unit 2310 is protected.

Figure 7:
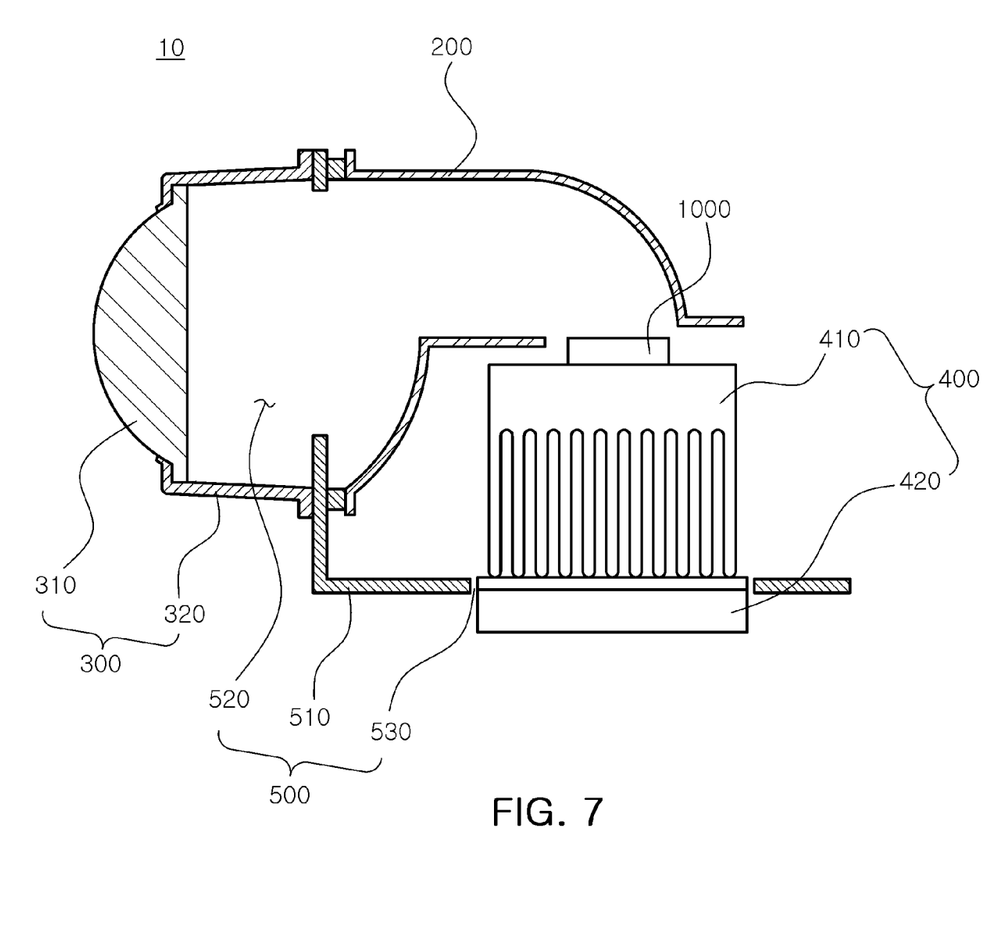
FIG. 7 is a cross-sectional view illustrating a vehicle headlight according to an example of the present application.
Figure 8:
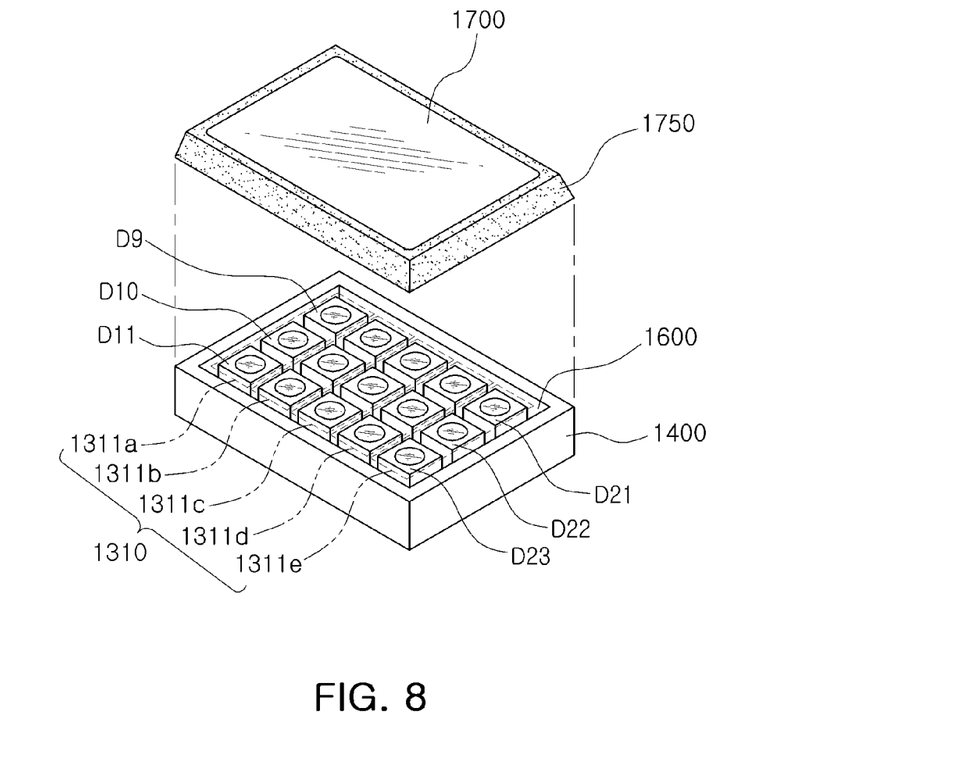
FIG. 8 is a perspective view of a light source apparatus of a vehicle headlight in FIG. 7.

Hereinafter, a vehicle headlight 10 according to an example of the present application will be described. FIG. 7 is a cross-sectional view illustrating a vehicle headlight according to an example of the present application, and FIG. 8 is a perspective view of a light source apparatus of a vehicle headlight in FIG. 7.

First, as illustrated in FIG. 7, a vehicle headlight 10 according to an example of the present application includes the light source apparatus 1000, a reflective unit 200, and a lens cover unit 300, and may further include a heat dissipation unit 400 dissipating heat generated by the light source apparatus 100 to the outside.

As described above, the light source apparatus 1000 is electrically connected to the external power source unit 1000 to serve as a light source emitting light when power is supplied thereto. As illustrated in FIG. 8, the light source apparatus 1000 may include the light emitting device array unit 1310 in which the light emitting device strings 1311 are connected in parallel. The first detection unit 1320 detects whether any one of the light emitting device strings 1311 is opened. The driving unit 1220 supplies driving power to the light emitting device array unit 1310. The second detection unit 1230 detects whether the light emitting device array unit 1310 is opened or short-circuited, and the interruption unit 1210 interrupting power supplied to the driving unit 1220. Thus, when any one of the light emitting devices of the light emitting device array unit 1310 is damaged to be opened or when both ends of the light emitting device array unit 1310 is opened or short-circuited, all the light emitting devices are turned off. Power supplied to the driving unit 1220 is also interrupted, thus protecting the light source apparatus 1000 including the light emitting device array unit 1310.

The reflective unit 200 is provided in an upper side of the light source apparatus 1000 and the heat dissipation unit 400 to guide light output from the light source apparatus 1000 to allow the light to be reflected. A section of the reflective unit 200 is a dome-like shape to guide light emitted from the light emitting devices D9 to D23 to proceed toward a front side of a vehicle, and a front portion of the reflective unit 200 is opened to allow the reflected light to be output outwardly.

The light emitting device array unit 1310 may include a body 1400 having a cavity 1600 accommodating the plurality of light emitting devices D9 to D23 and a lens unit 1700 coupled to the body 1400 to cover the cavity 1600. The lens unit 1700 is coupled to an upper surface of the body 1400 such that it covers the cavity 1600, to thus concentratively irradiate light generated from the plurality of light emitting devices D9 to D23. The lens unit 1700 may have a plate structure having a rectangular shape having a quadrangular cross-sectional shape, and may have a shape corresponding to that of the body 1400 as a whole. The lens unit 1700 may be configured such that a lateral surface thereof is sloped downwardly toward a lower surface thereof, so a size of a sectional area of the lens unit 1700 is increased from an upper surface toward the lower surface thereof. Also, in order to effectively focus light, a reflective film 1750 may be provided on the lateral surface of the lens unit 1700. The reflective film 1750 may be formed by coating a material having a high degree of reflectivity, like a silver coating, or attaching such a material as a thin film. The lens unit 1700 may be made of a glass material having excellent heat resistance characteristics and may be coupled to the body 1400 through a UV-curing or thermosetting adhesive, thereby preventing moisture from infiltrating into the body 1400.

The lens cover unit 300 radiates light output upon being reflected by the reflective unit 200 to the outside, and includes a hollow guide 320 and a lens 310. The guide 320 is installed along a front hole 520 of the housing 500, and guides light passing through the front hole 520 after being reflected by the reflective unit 200 to a front side. The guide 320 is a plastic injection-molded product having a hollow cylindrical structure to accommodate the lens 310 therein and is formed through injection molding. Here, the lens 310 may be installed in a front side of the guide 320 to refract and disperse light toward a front side of the vehicle. The lens 310 may be made of a transparent material.

The vehicle headlight 10 according to an example of the present application may further include the heat dissipation unit 400 and the housing 500 fixedly supporting the reflective unit 200.

The light source apparatus 1000 may be installed on the heat dissipation unit 400. The heat dissipation unit 400 may include a heat sink 410 and a cooling fan 420. The heat dissipation unit 1000 may be provided under the light source apparatus 1000 and dissipate heat generated by the light source apparatus 1000 externally.

The heat sink 410, having the light source apparatus 1000 mounted thereon, dissipates high temperature heat generated by the light source apparatus 1000 to the outside. Here, in order to increase a surface area, the heat sink 410 may have a plurality of recesses formed on a lower surface thereof.

The cooling fan 420 may be installed under the heat sink 410 to increase heat dissipation efficiency of the heat sink 410.

The housing 500 includes a central hole 530 formed in a penetrative manner on one side thereof to allow the heat dissipation unit 400 to be coupled thereto and installed therein, and the front hole 520 formed in a penetrative manner on the other side integrally connected to the one side and bent in a right angle direction to allow the reflective unit 200 to be fixedly positioned at an upper side of the light source apparatus 1000. Thus, the reflective unit 200 is fixed to the housing 500 such that the opened front side of the reflective unit 200 corresponds to the front hole 520 of the housing 500 to allow light reflected by the reflective unit 200 to pass through the front hole 520 so as to be output externally.

As set forth above, in the case of the light source apparatus and the vehicle headlight using the same according the present examples, a uniform quantity of light can be maintained and damage can be prevented.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light source apparatus comprising:
a light emitting device array unit in which light emitting device strings connected in parallel are formed by connecting a plurality of light emitting devices in series;
a first detection unit connected to an output terminal of the light emitting device array unit and configured to detect whether any one of the light emitting device strings is opened;
a driving unit configured to supply driving power to the light emitting device array unit;
a second detection unit configured to detect whether an opening or a short-circuit between an input terminal and the output terminal of the light emitting device array unit has occurred; and
an interruption unit including a third switching element connected between an input terminal of the driving unit and an external power source, and configured to:
connect the external power source applying power to the driving unit to the input terminal of the driving unit by switching on the third switch element, and
interrupt power supplied to the driving unit by switching off the third switch element when an opening is detected by the first detection unit, or when an opening or a short-circuit is detected by the second detection unit.

2. The light source apparatus of claim 1, wherein the first detection unit comprises:
a plurality of switching elements connected to the plurality of light emitting device strings in series, respectively,
wherein collectors of the switching elements are connected to the light emitting device strings, and emitters thereof are connected to bases of different adjacent switching elements such that the switching elements are sequentially connected.

3. The light source apparatus of claim 1, wherein:
the second detection unit comprises a switching element, and
the switching element turns off an output signal output to the interruption unit when a current applied to a gate thereof from the driving unit is interrupted.

4. The light source apparatus of claim 3, wherein the switching element is a transistor.

5. The light source apparatus of claim 1, wherein:
the interruption unit further comprises first and second switching elements,
a base of the second switching element is connected to an output terminal of the second detection unit and a collector thereof is connected to a gate of the third switching element, so that when an opening is detected by the second detection unit, the second switching element is turned off to interrupt a current flowing through the third switching element,
a base of the first switching element is connected to an output terminal of the first detection unit and a collector thereof is connected to an emitter of the second switching element, so that when opening is detected by the second detection unit, the first switching element is turned off to interrupt a current flowing through the second switching element, and
a gate of the third switching element is connected to the collector of the second switching element, so that when the first or second switching element is turned off, the third switching element is also turned off to cut off power supplied to the driving unit.

6. The light source apparatus of claim 5, wherein the first and second switching elements are transistors.

7. The light source apparatus of claim 5, wherein the third switching element is a P-channel field effect transistor (FET).

8. The light source apparatus of claim 5, wherein the interruption unit further comprises:
a capacitor connected to a source and a drain of the third switching element in parallel.

9. The light source apparatus of claim 1, further comprising a diode connected to an input terminal of the interruption unit in a forward direction.

10. A vehicle headlight comprising:
a light emitting device array unit in which light emitting device strings connected in parallel are formed by connecting a plurality of light emitting devices in series;
a first detection unit connected to an output terminal of the light emitting device array unit and configured to detect whether any one of the light emitting device strings is opened;
a driving unit configured to supply driving power to the light emitting device array unit;
a second detection unit configured to detect whether an opening or a short-circuit between an input terminal and the output terminal of the light emitting device array unit has occurred; and
an interruption unit including a third switching element connected between an input terminal of the driving unit and an external power source, and configured to:
connect the external power source applying power to the driving unit to the input terminal of the driving unit by switching on the third switch element, and
interrupt power supplied to the driving unit by switching off the third switch element when an opening is detected by the first detection unit, or when an opening or a short-circuit is detected by the second detection unit;
a reflective unit provided above the light emitting device array unit to reflect light output from the light emitting device array unit; and
a lens cover unit dispersing light reflected by the reflective unit to the outside.

11. The vehicle headlight of claim 10, wherein the first detection unit includes:
a plurality of switching elements connected to the plurality of light emitting device strings in series, respectively,
wherein collectors of the switching elements are connected to the light emitting device strings and emitters thereof are connected to bases of different adjacent switching elements such that the switching elements are sequentially connected.

12. The vehicle headlight of claim 10, wherein:
the second detection unit comprises a switching element,
the switching element turns off an output signal output to the interruption unit when a current applied to a gate thereof from the driving unit is interrupted.

13. The vehicle headlight of claim 12, wherein the switching element is a transistor.

14. The vehicle headlight of claim 10, wherein:
the interruption unit further comprises first and second switching elements,
a base of the second switching element is connected to an output terminal of the second detection unit and a collector thereof is connected to a gate of the third switching element, so that when opening is detected by the second detection unit, the second switching element is turned off to interrupt a current flowing through the third switching element,
a base of the first switching element is connected to an output terminal of the first detection unit and a collector thereof is connected to an emitter of the second switching element, so that when opening is detected by the second detection unit, the first switching element is turned off to interrupt a current flowing through the second switching element, and a gate of the third switching element is connected to the collector of the second switching element, so that when the first or second switching element is turned off, the third switching element is also turned off to cut off power supplied to the driving unit.

15. The vehicle headlight of claim 10, further comprising:
a heat dissipation unit provided under the light emitting device array unit to dissipate heat generated by the light emitting device array unit outwardly.

16. The vehicle headlight of claim 15, further comprising a housing fixedly supporting the reflective unit and coupled to the heat dissipation unit.

17. The vehicle headlight of claim 15, wherein the heat dissipation unit further comprises a fan to dissipate heat generated by the light emitting device array unit outwardly.

18. The vehicle headlight of claim 16, wherein the lens cover unit comprises a hollow guide and lens, the hollow guide positioned on a front side of the housing.

19. The vehicle headlight of claim 18, wherein the lens comprises a transparent material.

20. The vehicle headlight of claim 10, wherein the reflective unit includes a dome shaped section for reflecting light output from the light emitting device array unit towards the lens cover unit.

* * * * *